(12) United States Patent
Kim et al.

(10) Patent No.: US 6,514,841 B2
(45) Date of Patent: Feb. 4, 2003

(54) METHOD FOR MANUFACTURING GATE STRUCTURE FOR USE IN SEMICONDUCTOR DEVICE

(75) Inventors: Yong-Soo Kim, Ichon-shi (KR); Su-Jin Oh, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 23 days.

(21) Appl. No.: 09/891,503

(22) Filed: Jun. 27, 2001

(65) Prior Publication Data

US 2002/0004313 A1 Jan. 10, 2002

(30) Foreign Application Priority Data

Jun. 30, 2000 (KR) ........................................ 2000-36850

(51) Int. Cl.$^7$ ................. H01L 21/3205; H01L 21/4763
(52) U.S. Cl. ........................ 438/592; 438/585; 438/591
(58) Field of Search ................................ 438/592, 591, 438/585

(56) References Cited

U.S. PATENT DOCUMENTS

| | | | | |
|---|---|---|---|---|
| 6,277,719 | B1 | * | 8/2001 | Chern et al. |
| 6,303,483 | B1 | * | 10/2001 | Kunikiyo |
| 6,362,086 | B2 | * | 3/2002 | Weimer et al. |
| 6,444,592 | B1 | * | 9/2002 | Ballantine et al. |
| 2002/0072209 | A1 | * | 6/2002 | Tseng |

* cited by examiner

*Primary Examiner*—Long Pham
(74) *Attorney, Agent, or Firm*—Jacobson Holman PLLC

(57) ABSTRACT

A method for manufacturing a gate structure for use in a semiconductor device including the steps of sequentially forming a gate oxide layer, a polysilicon layer, a tungsten layer and a nitride layer on top of a semiconductor substrate, patterning the nitride layer, the tungsten layer, the polysilicon layer and the gate oxide layer into a predetermined configuration, and carrying out a rapid thermal annealing (RTA) in an $NH_3$ ambient, thereby forming a diffusion barrier layer between a patterned tungsten layer and a patterned polysilicon layer.

15 Claims, 2 Drawing Sheets

METHOD FOR MANUFACTURING GATE STRUCTURE FOR USE IN SEMICONDUCTOR DEVICE

FIELD OF THE INVENTION

The present invention relates to a semiconductor device and, more particularly, to a method for manufacturing a gate structure for use in a semiconductor device by forming a diffusion barrier layer through a rapid thermal annealing process after patterning the gate structure.

DESCRIPTION OF THE PRIOR ART

Generally, a polysilicon is used for forming a word line in a semiconductor device and the word line is formed in a stack scheme. As a result, methods have been proposed for forming the word line with the stack scheme according to a method for forming a diffusion barrier layer which prevents an inter-diffusion of silicon atoms between the polysilicon layer and a gate electrode. In particular, a double layer provided with a polysilicon layer and a tungsten (W) layer is popularly used for the word line with a stack scheme.

FIGS. 1A and 1B are cross sectional views setting forth a conventional method for forming the word line. To begin, a gate oxide layer 12, a polysilicon layer 13, a diffusion barrier layer 14 and then a tungsten (W) layer 15 are formed on a semiconductor substrate 11, as shown in FIG. 1A.

Thereafter, a hard mask of a nitride layer is formed on the tungsten layer 15 and then patterned into a predetermined configuration, thereby obtaining a hard mask pattern 16. Subsequently, the tungsten layer 15, the diffusion barrier layer 14, the polysilicon layer 13 and the gate oxide layer 12 are patterned into the predetermined configuration, thereby obtaining a gate structure provided with a patterned gate oxide layer 12A, a patterned polysilicon layer 13A, a patterned diffusion barrier layer 14A and a patterned tungsten layer 15A, as shown in FIG. 1B.

Conventionally, the gate structure incorporating therein the diffusion barrier layer 14 is formed by one of three methods, wherein the first method is to form the gate structure using a W/WN$_x$ (tungsten nitride) or TiN (titanium nitride) stack scheme, the second method is to form the gate structure using a denuded W scheme and the third method is to form the gate structure using a low temperature W scheme.

In the first method of the W/WN$_x$ or TiN scheme, a WN$_x$ layer or a TiN layer and a W layer are formed on the polysilicon layer subsequently, wherein a thickness of the WN$_x$ layer or the TiN layer is approximately 100 Å and a thickness of the tungsten layer is approximately 800 Å. The WN$_x$ layer or the TiN layer is used as the diffusion barrier layer in order to prevent the inter-diffusion of silicon atoms between the W layer and the polysilicon layer. However, when using the W/TiN scheme, there are problems of a high sheet resistance and a bad gap-fill capability for depositing an interlayer dielectric (ILD) layer in a post-manufacturing step. Further, it is difficult to apply a selective oxidation process for the W/TiN scheme because the TiN has a poor oxidation characteristic. When using the W/WN$_x$ scheme, there is a disadvantage in that two chambers having tungsten targets are needed for depositing the W layer and the WN$_x$ layer, sequentially. And further, in order to deposit the W layer and the WNx layer successively in the same chamber, the tungsten nitride in the target should be removed, whereby many targets and dummy wafers are consumed.

The second method of the denuded W scheme is to form the WN$_x$ layer on the polysilicon layer. Then, a rapid thermal annealing (RTA) is carried out in an N$_2$ ambient so that nitrogen atoms diffuse out from the WN$_x$ layer. As a result, the WN$_x$ layer is changed into a W layer and a WSiN layer of the diffusion barrier layer is formed beneath the W layer. However, because the second method is carried out at a high temperature, e.g., 1,000° C. for decreasing the sheet resistance, characteristics of the semiconductor device may be degraded eventually.

In the third method of the low temperature W scheme, after forming the W layer on the polysilicon layer, the RTA process is carried out in an NH$_3$ ambient, thereby obtaining a WSiN layer as the diffusion barrier layer between the W layer and the polysilicon layer. But this scheme is highly dependent upon the suitability of the structure of the polysilicon layer. For example, if the polysilicon layer has an amorphous structure, a tungsten silicide (WSi$_x$) is apt to be formed and grown up during a post thermal treatment. Therefore, the electrical property of the gate electrode is degraded because the tungsten silicide has a higher resistivity than that of pure tungsten. In addition, if the polysilicon layer has a polycrystalline structure, the tungsten silicide also may be formed at a pattern edge of a gate structure and be grown up during the thermal treatment. Thus, derivability of the semiconductor device is degraded eventually.

SUMMARY OF THE INVENTION

It is, therefore, an object of the present invention to provide a method for manufacturing a gate structure for use in a semiconductor device with stabilized derivability by forming a diffusion barrier layer through a rapid thermal annealing process after patterning the gate structure.

In accordance with one aspect of the present invention, there is provided a method comprising steps of a) forming a gate oxide layer, a polysilicon layer, a tungsten layer and a nitride layer on top of a semiconductor substrate, sequentially; b) patterning the nitride layer, the tungsten layer, the polysilicon layer and the gate oxide layer into a predetermined configuration; and c) carrying out a rapid thermal annealing (RTA) in an NH$_3$ ambient, thereby forming a diffusion barrier layer between a patterned tungsten layer and a patterned polysilicon layer.

BRIEF DESCRIPTION OF THE DRAWINGS

The above and other objects and features of the present invention will become apparent from the following description of the preferred embodiment given in conjunction with the accompanying drawings, in which.

DETAILED DESCRIPTION OF THE PREFERRED EMBODIMENTS

Figure 1A:
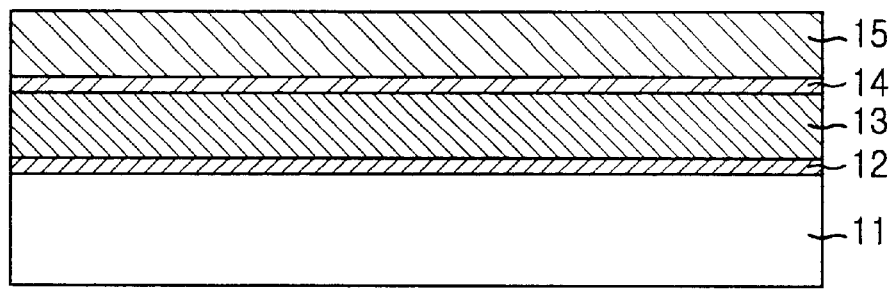
FIGS. 1A and 1B are cross sectional views setting forth a conventional method for manufacturing a gate structure.
Figure 1B:
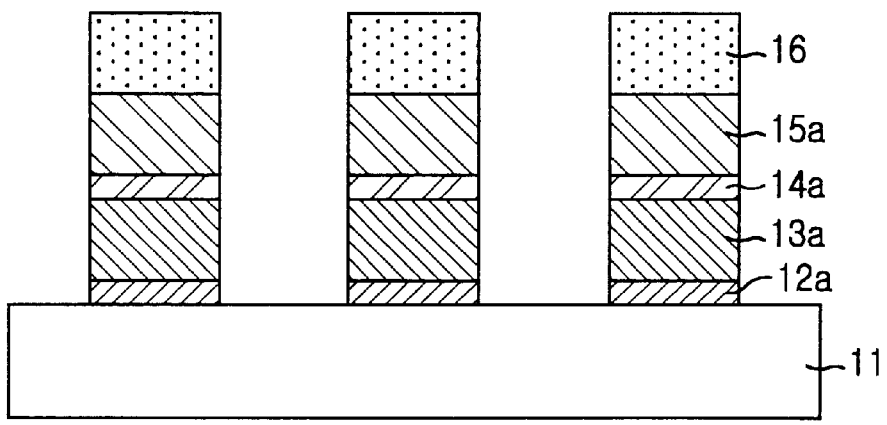
Figure 2A:
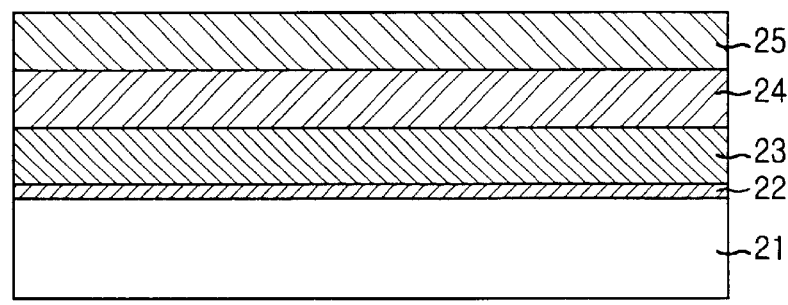
FIGS. 2A to 2C are cross sectional views setting forth a method for manufacturing a gate structure in accordance with a preferred embodiment of the present invention.
Figure 2B:
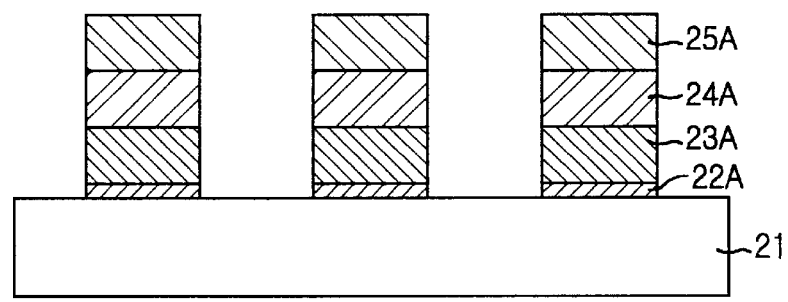
Figure 2C:
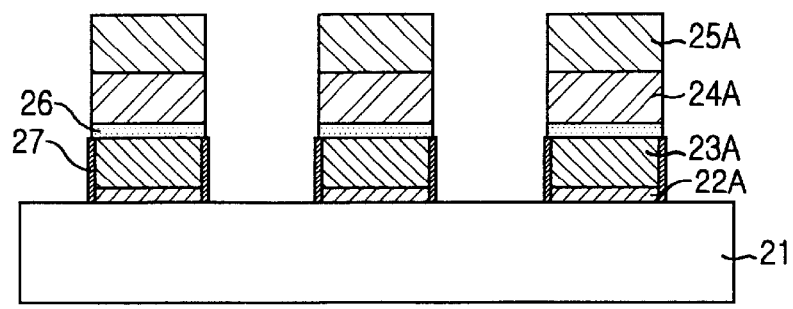

There are provided in FIGS. 2A to 2C cross sectional views setting forth a method for forming a gate structure in accordance with a preferred embodiment of the present invention.

The manufacturing steps begin with the preparation of a semiconductor substrate upon which predetermined manufacturing steps have been carried out. Thereafter, a gate oxide layer 22, a polysilicon layer 23, a tungsten layer 24 and a nitride layer 25 of a hard mask are sequentially formed on top of the semiconductor substrate, as shown in FIG. 2A.

It is preferable that the gate oxide layer 22 be made of a SiO$_2$, SiN$_x$, Si$_3$N$_4$, SiON, TaO$_2$ or TaON layer and the nitride layer be made of a SiN layer. The polysilicon layer 23 is formed to a thickness ranging from approximately 300 Å to approximately 1,000 Å using an amorphous silicon, a polycrystalline silicon or an epi-silicon. The formation of the polysilicon layer 23 is accomplished by a chemical vapor deposition (CVD), a thermal CVD (TCVD) or a plasma enhanced CVD (PECVD) technique. The tungsten layer 24 is formed to a thickness ranging from approximately 400 Å to approximately 1,000 Å by using a physical vapor deposition (PVD) or the CVD technique. And the nitride layer 25 is formed to a thickness ranging from approximately 500 Å to approximately 3,000 Å by using the CVD technique in a furnace or in a chamber.

In a next step, the nitride layer 25, the tungsten layer 24, the polysilicon layer 23 and the gate oxide layer 22 are patterned into a predetermined configuration, thereby forming a gate structure provided with a patterned gate oxide layer 22A, a patterned polysilicon layer 23A, a patterned tungsten layer 24A and a patterned nitride layer 25A, as shown in FIG. 2B.

Thereafter, a RTA process is carried out for approximately 10 seconds to approximately 50 seconds in an NH$_3$ ambient under conditions such that a flux of NH$_3$ ranges from approximately 1 slm to approximately 20 slm and a temperature ranges from approximately 500° C. to approximately 900° C. During the RTA process, nitrogen ions or nitrogen atoms diffuse along grain boundaries of the patterned tungsten layer 24A and the patterned polysilicon layer 23A, thereby forming a diffusion barrier layer 26 such as a WSiN layer or a WSiON layer between the patterned tungsten layer 24A and the patterned polysilicon layer 23A, as shown in FIG. 2C. At this time, since the nitrogen ions diffuse rapidly along the grain boundaries thereof, it is possible to obtain the WSiN layer or the WsiON layer easily with a predetermined thickness at a low temperature. This is a significant improvement over the prior art in which the diffusion barrier layer is formed at a high temperature, e.g., at approximately 800° C. Furthermore, according to the present invention the nitrogen ions diffuse into surfaces between the patterned layers so that it is possible to fully protect the patterned layers.

By forming the diffusion barrier layer 26 after patterning the layers in the embodiment of the present invention, it is possible to enhance an etching selectivity for the patterned tungsten layer 24A and the patterned polysilicon layer 23A at the interface between the patterned tungsten layer 24A and the patterned polysilicon layer 23A. Therefore, it is possible to inhibit the formation of tungsten silicide (WSi$_x$) caused by etch attack and a post thermal treatment.

After the RTA process for forming the diffusion barrier layer 26, a selective oxidation process is performed in an H$_2$O/O$_2$ or an O$_2$/H$_2$ ambient for recovering the etch damage, thereby forming oxide layers 27 on the sides of the patterned polysilicon layer 23A and the patterned gate oxide layer 22A. In the selective etching process, the patterned tungsten layer 24A is not oxidized. The RTA process and the selective oxidation process are carried out in-situ under conditions in which a pressure is approximately 120 Torr, a temperature is approximately 950° C. and a partial pressure of oxygen gas (O$_2$) is approximately 10%.

According to the present invention, the word line is formed in a stack type, but the invention is not limited to this embodiment. That is, the inventive method can be applied to a metal oxide semiconductor (MOS) transistor having a buried channel or a surface channel using the tungsten-polysilicon gate structure. In addition, the present invention also can be applied to an MOS transistor having the surface channel using dual tungsten-polysilicon gate structure.

While the present invention has been described with respect to the particular embodiments, it will be apparent to those skilled in the art that various changes and modifications may be made without departing from the scope of the invention as defined in the following claims.

What is claimed is:

1. A method for manufacturing a gate structure for use in a semiconductor device, the method comprising steps of:
   a) forming a gate oxide layer, a polysilicon layer, a tungsten layer and a nitride layer on top of a semiconductor substrate, sequentially;
   b) patterning the nitride layer, the tungsten layer, the polysilicon layer and the gate oxide layer into a predetermined configuration; and
   c) carrying out a rapid thermal annealing (RTA) in an NH$_3$ ambient, thereby forming a diffusion barrier layer between a patterned tungsten layer and a patterned polysilicon layer.

2. The method of claim 1, after the step c), further comprising a step of carrying out a selective oxidation in order to form oxide layers on sides of the patterned polysilicon layer and a patterned gate oxide layer.

3. The method of claim 1, wherein the step c) is carried out in a furnace at a temperature ranging from approximately 500° C. to approximately 900° C. for approximately 10 seconds to approximately 50 seconds.

4. The method of claim 1, wherein the gate oxide layer includes a material selected from the group consisting of SiO$_2$, SiN$_4$, Ta$_2$O$_5$ and TaON.

5. The method of claim 1, wherein the step c) is carried out under a condition such that a flux of NH$_3$ gas ranges from approximately 1 slm to approximately 20 slm.

6. The method of claim 2, wherein the step of carrying out the selective oxidation is performed in an H$_2$O/O$_2$ ambient.

7. The method of claim 2, wherein the step of carrying out the selective oxidation is performed in an O$_2$/H$_2$ ambient.

8. The method of claim 1, wherein the polysilicon layer is formed using a material selected from the group consisting of an amorphous silicon, a polycrystalline silicon and an epi-silicon.

9. The method of claim 8, wherein the polysilicon is formed using the amorphous silicon after carrying out a thermal treatment.

10. The method of claim 1, wherein the polysilicon layer is formed by using a method selected from the group consisting of a chemical vapor deposition (CVD), a thermal CVD and a plasma enhanced CVD.

11. The method of claim 1, wherein the polysilicon layer is formed to a thickness ranging from approximately 300 Å to approximately 1,000 Å.

12. The method of claim 1, wherein the diffusion barrier layer includes a material selected from the group consisting of WSiN and WSiON.

13. The method of claim 1, wherein the tungsten layer is formed to a thickness ranging from approximately 400 Å to 1,000 Å by using a method selected from the group consisting of a physical vapor deposition (PVD) and the CVD.

14. The method of claim 1, wherein the nitride layer is formed to a thickness ranging from approximately 500 Å to 3,000 Å by using a CVD method.

15. The method of claim 2, wherein the step c) and the step of carrying out the selective oxidation are performed under conditions that a pressure is approximately 120 Torr, a temperature is approximately 950° C. and a partial pressure of oxygen gas ($O_2$) is approximately 10%.

* * * * *